(12) United States Patent
Prenninger et al.

(10) Patent No.: US 10,145,900 B2
(45) Date of Patent: Dec. 4, 2018

(54) METHOD FOR DETERMINING CRITICAL OPERATING STATES IN A FUEL CELL STACK

(71) Applicant: AVL LIST GMBH, Graz (AT)

(72) Inventors: Peter Prenninger, Graz (AT); Katharina Renner, Graz (AT)

(73) Assignee: AVL LIST GMBH, Graz (AT)

( * ) Notice: Subject to any disclaimer, the term of this patent is extended or adjusted under 35 U.S.C. 154(b) by 653 days.

(21) Appl. No.: 14/398,038

(22) PCT Filed: May 2, 2013

(86) PCT No.: PCT/EP2013/059172
§ 371 (c)(1),
(2) Date: Oct. 30, 2014

(87) PCT Pub. No.: WO2013/164415
PCT Pub. Date: Nov. 7, 2013

(65) Prior Publication Data
US 2015/0153418 A1    Jun. 4, 2015

(30) Foreign Application Priority Data
May 3, 2012   (AT) .............................. A 50154/2012

(51) Int. Cl.
| H01M 8/00 | (2016.01) |
| G01R 31/36 | (2006.01) |
| H01M 8/04992 | (2016.01) |
| H01M 8/1018 | (2016.01) |
| H01M 8/04537 | (2016.01) |
| H01M 8/04664 | (2016.01) |

(52) U.S. Cl.
CPC ..... *G01R 31/3627* (2013.01); *G01R 31/3606* (2013.01); *G01R 31/3662* (2013.01); *H01M 8/04552* (2013.01); *H01M 8/04559* (2013.01); *H01M 8/04582* (2013.01); *H01M 8/04589* (2013.01); *H01M 8/04641* (2013.01); *H01M 8/04649* (2013.01); *H01M 8/04671* (2013.01); *H01M 8/04679* (2013.01); *H01M 8/04992* (2013.01); *H01M 8/1018* (2013.01)

(58) Field of Classification Search
USPC .......................... 307/104; 429/90, 431, 432
See application file for complete search history.

(56) References Cited

U.S. PATENT DOCUMENTS

| 7,531,253 | B2 | 5/2009 | Ramschak |
| 2003/0184307 | A1 | 10/2003 | Kozlowski et al. |
| 2006/0078788 | A1* | 4/2006 | Ramschak ......... G01R 31/3624 429/90 |

* cited by examiner

*Primary Examiner* — Lam Nguyen
(74) *Attorney, Agent, or Firm* — Dykema Gossett PLLC

(57) ABSTRACT

The invention relates to a method for determining critical operating states in a fuel cell stack, consisting of single cells connected in series, wherein a low-frequency current or voltage signal is applied to the fuel cell stack, the resulting voltage or current signal is measured and the distortion factor thd is determined. According to the invention, the weighted sum of a term dependent on the membrane resistance Rm and a term dependent on the distortion factor thd is used to determine an indicator $THDA_{dryout}$ correlating with the drying out of the fuel cell membranes of the fuel cell stack, the membrane resistance Rm being detected by impedance measurement.

10 Claims, 4 Drawing Sheets

METHOD FOR DETERMINING CRITICAL OPERATING STATES IN A FUEL CELL STACK

The invention relates to a method for determining critical operating states in a fuel cell stack, consisting of individual cells switched in series, wherein a low-frequency current or voltage signal is applied to the fuel cell stack, the resulting voltage or current signal is measured and the distortion factor of the measured signal is determined.

Quality assurance requires checking the functionality and the performance of all cells in the production of fuel cells. This occurs according to the state of the art by means of measuring the individual cell voltages for example. Due to the greater technical effort however the measurement of individual cell voltages is neither desirable in production nor during operation of fuel cells.

In the laboratory, the so-called impedance spectroscopy is also used for detecting the operating state or "state of health" of the fuel cell stack. In this process, the complex impedance (i.e. impedance locus curve) of the fuel cell stack is measured over a specific frequency range and mostly compared with reference curves.

Depending on the frequency at which typical changes occur in the impedance curve, it can now be distinguished whether these changes originate from the anode, cathode or the membrane of the individual cells. The method is based on the fact that the electrical equivalent circuit for the fuel cell stack is a series-parallel circuit of low-pass elements of the first order, whose cut-off frequencies are situated significantly far apart and the desired selectivity can therefore be achieved.

It is the following effects in the fuel cell stack (e.g. in a PEM fuel cell stack operated with air and $H_2$) that substantially require monitoring.

Undersupply of oxidizing agents or fuel at the cathode or anode (hypostoichiometry). Effect: UI characteristic curve drops already at lower currents.

Membrane: Formation of electrical short-circuits or gas short-circuits. Effect: $U_o$ (voltage at current=0) changes.

Electrode ageing. Effect: UI characteristic curve drops more steeply, higher ohmic resistance by corrosion effects.

The disadvantage in pure impedance spectroscopy is the relatively high measuring effort. In addition, impedance spectroscopy is time-consuming because it is necessary to measure the impedance in the steady-state in each of the gradually rising frequencies.

"Total Harmonic Distortion Analysis" (THDA) offers advantages in this respect, which represents an online diagnostic tool for determining the state of fuel cell stacks. Parameters can be extracted with a relatively low amount of measuring effort, which parameters can be used for the further calculations of the state variables of the fuel cell stack.

Such a method, which is based on the analysis of the distortion factor, is described in detail in EP 1 646 101 B1, in which a low-frequency current or voltage signal is applied to the fuel cell stack, the resulting voltage or current signal is measured and conclusions are drawn on the operating state of individual cells of the fuel cell stack from at least one change in the harmonic component (or the distortion factor) of the signal. This allows an online evaluation of the aforementioned measurements with respect to recognizing and classifying critical operating states at the system level.

Distortion factor analysis can occur either in the time range by using filters (digital or analog filters) or by means of transformation in the frequency range (application of all types of wavelet transformations, short-time Fourier transformations or fast-Fourier transformations). The advantage of frequency transformation is that the signal-to-noise ratio is improved considerably by this transformation, which again increases the sensitivity of the measuring method.

It is the object of the invention, on the basis of the method known from EP 1 646 101 B1, to propose method variations based on the analysis of the distortion factor, with which different critical operating states of fuel cell stacks can be distinctly detected, such as:

Hypostoichiometry at the anode/cathode of the stack
Drying out of the membranes of the stack
Accumulation of water, formation of droplets on the membranes
Deviation of the current minimal cell voltage from the average cell voltage A first variant of the invention provides that the weighted sum of a term dependent on the membrane resistance $R_m$ and a term dependent on the distortion factor thd is used for determining an indicator $THDA_{dryout}$ correlating with the drying out of the fuel cell membranes of the fuel cell stack, wherein the membrane resistance $R_m$ is detected by impedance measurement.

A second variant of the invention provides that the weighted sum total of a term dependent on the internal resistance $R_i$, a term dependent on the distortion factor thd and a term dependent on the impedance $R_{lm}$ of the low-frequency signal is used for determining an indicator $THDA_{low\ media}$ correlating with the stoichiometric undersupply of the anode and/or cathode side of the fuel cell stack.

A third variant of the invention provides that the parameters $thd_{dif0}$ and $thd_{dif1}$, as well as the fluctuations fd(V) in the measured voltage curve are used for determining an indicator $THDA_{liquid}$ correlating with impermissible water accumulations and droplet formations on the membranes of the fuel cell stack. $thd_{dif0}$ and $thd_{dif1}$ respectively concern linear combinations of the distortion factors of current and voltage, wherein $thd_{dif0}$ comprises the component of the first overtones and $thd_{dif1}$ the component of the second overtones.

The indicator $THDA_{dryout}$ provides a statement in percentage on the dryness state of the membranes in the stack. $THDA_{low\ media}$ supplies the degree of media undersupply at the cathode or the anode (the media include air, hydrogen or methanol in this case for example). $THDA_{liquid}$ indicates the occurrence of undesirable water accumulations.

According to a first advantageous further development of the invention, a simplified electrical equivalent circuit of the fuel cell stack can be used for determining an indicator SoH correlating with the ageing of the fuel cell stack, which equivalent circuit at least considers the ohmic resistances of the cathode side and the anode side $R_1$, $R_2$, as well as the double-layer capacitances $C_1$, $C_2$ on the anode and cathode sides and the inductance $L_m$, wherein the parameters for an equation system for the variables $R_1$, $R_2$, $C_1$, $C_2$, $L_m$ to be determined is set up from impedance measurements in at least three measuring frequencies, and whose solution is used at least partly for calculating the indicator SoH.

Three measuring frequencies are preferably selected for the calculation in which the impedance curve of the simplified equivalent circuit substantially coincides with the real impedance curve of the fuel cell stack.

According to a second advantageous further development of the invention, an artificial neural network (Artificial Neural Network, ANN) can be used for determining an indicator avg-min which correlates with the deviation of the currently minimal cell voltage from the average cell voltage, wherein measured quantities derived from the distortion factor analysis THDA and impedance values derived from the real and imaginary component of the applied voltage signal are used as input quantities of the neural network, and wherein the neural network is trained by means of signals from individual cell voltage measurements for determining the internal network parameters.

This approach can be expanded in a modular fashion in that the training data record is supplemented by parameters from physical models. The precision of the simulation can thus be improved.

A double-layer feed-forward artificial neural network FFANN (feed-forward Artificial Neural Network) can preferably be used for simulating the indicator avg-min correlating with the minimum of the cell voltage of an individual cell of the fuel cell stack, wherein the neural network is adjusted by means of a training function, preferably the Levenberg-Marquardt training function, to the measured values detected by means of individual cell voltage measurement.

The invention will be explained below in closer detail by reference to the schematic illustrations shown in the drawings, wherein.

Figure 1:
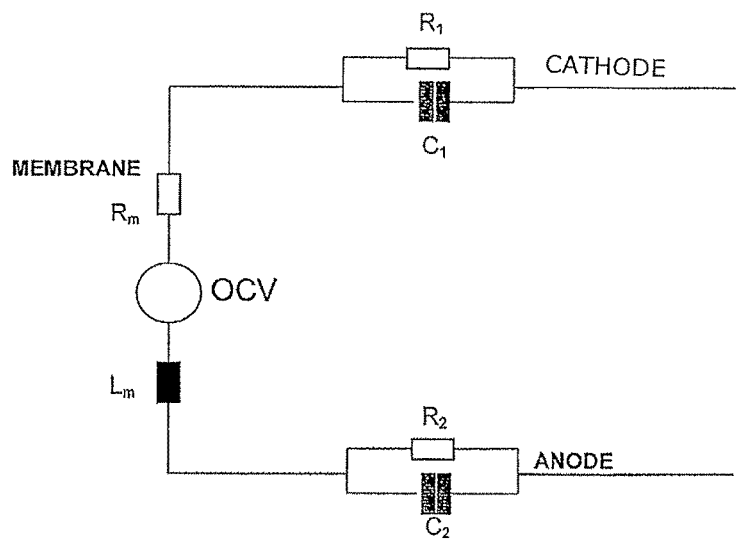
FIG. 1 shows an equivalent circuit of a fuel cell stack.

The equivalent circuit of the fuel cell stack according to FIG. 1 shows the ohmic resistances of the cathode and the anode ($R_1$, $R_2$) and the double-layer capacitances $C_1$, $C_2$ on the cathode and anode sides, the inductance of the membrane $L_m$ and the ohmic membrane resistance $R_m$. The open-circuit voltage of the stack is designated with reference OCV (open-circuit voltage).

Figure 2:
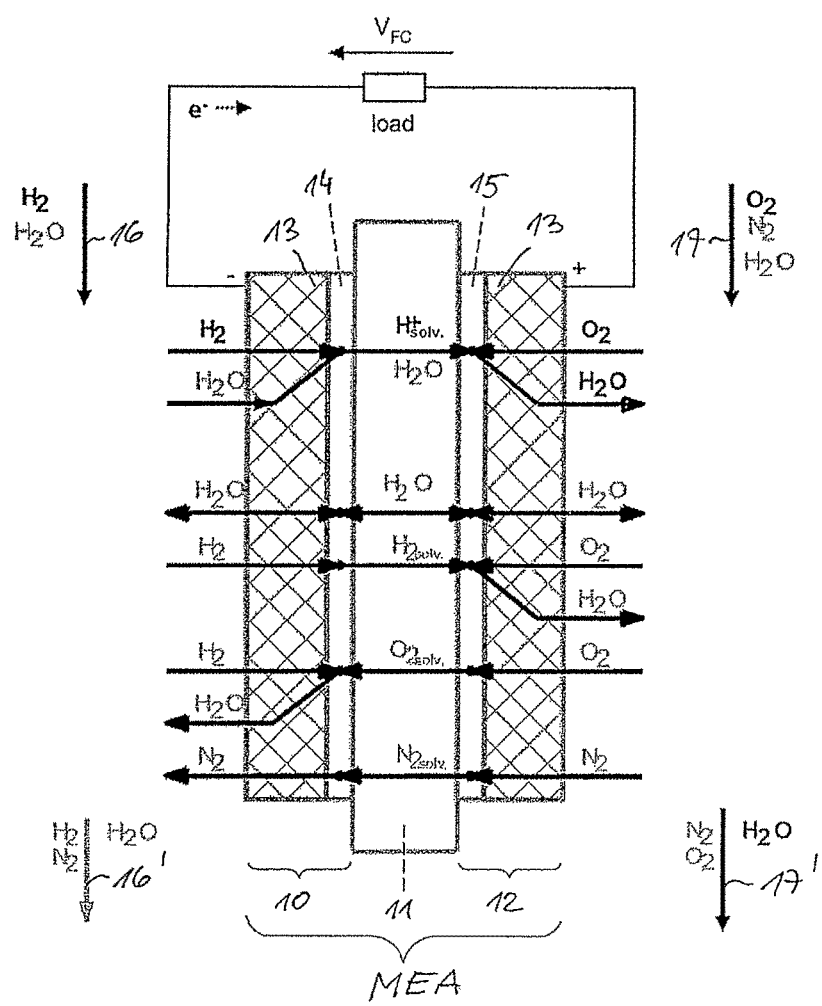
FIG. 2 shows a schematic sectional view of a PEM fuel cell.

FIG. 2 shows a schematic sectional view through a membrane-electrode unit MEA of a PEM fuel cell, comprising a membrane 11 disposed between an anode 10 and a cathode 12. Anode and cathode 10, 12 respectively consist of a diffusion layer 13 and a catalytic layer 14, 15. The supply of fuel, e.g. $H_2$, is marked at the anode with reference numeral 16, and the discharge with reference numeral 16'. The supply of the oxidizing agent (e.g. air) occurs at reference numeral 17 and the discharge at 17'.

$THDA_{dryout}$

From a highly simplified perspective, a PEM fuel cell is composed of two electrodes which are separated by a proton exchange membrane (Proton Exchange Membrane (PEM)), a proton-conductive membrane.

PEMs are polymer electrolyte membranes which are permeable to protons ($H^+$), which effectively prevent the transport of gaseous reagents such as oxygen or hydrogen.

In order to meet these requirements, the membrane must have a specific level of humidity among other things. If the membrane dries out, its conductivity decreases and thus also the performance of the fuel cell. In the worst of cases, cracks and holes are produced and the membrane is irreparably damaged. This strongly limits the functionality of the fuel cell and might even prevent it entirely.

It is necessary to optimize various operational parameters such as gas temperatures and relative humidity in order to achieve the best possible performance values and longest operational lifespan of the fuel cell.

Different causes can lead to errors in the operation of the fuel cell stack and result in a decrease in performance. A significant drop in the individual cell voltages can also be seen with decreasing humidification of the membrane.

Although this drop in voltage can be detected by means of conventional individual cell voltage monitoring, said drop cannot be allocated specifically to drying out without further indicators.

The application of the analytic algorithm $THDA_{dryout}$ to the raw measured values of the THDA measuring instrument offers the possibility to monitor parameters which allow drawing conclusions on the state of the membrane.

The relevant parameter for $THDA_{dryout}$ is the membrane resistance $R_m$ (see FIG. 1). Depending on the adjustment of specific system-dependent parameters ($\alpha_0, \alpha_1$, reference value ref depending on the age of the stack), a polynomial is obtained depending on the membrane resistance $R_m$ for the calculation of $THDA_{dryout}$. It can be seen that a rising membrane resistance is an indicator for increased drying out of the membrane. Furthermore, the distortion factor (thd, ratio of fundamental component to its harmonic component) is used as an additional indicator for the non-linear behavior of the system response.

$$THDA_{dryout} = \alpha_0 \left( \frac{R_m - ref}{ref} \right)^2 + \alpha_1 \cdot f(thd), \qquad \text{eqn. 1}$$

with system-dependent weightings $\alpha_0, \alpha_1$ with $0 < \alpha_0, \alpha_1 < 1$, wherein $\alpha_0 + \alpha_1 = 1$ and polynomial and logarithmic function f. The weightings $\alpha_0, \alpha_1$ are strongly system-dependent. The use of smoothing functions (sliding average, log, . . . ) depends highly on the structure and the components of the system because the signal quality can thus be influenced. The weighting parameters and smoothing functions are adjusted accordingly by calibration measurements which follow a special test program in order to support the highest possible significance of the data. The first term in equation 1 is usually weighted more strongly.

The membrane resistance $R_m$ can be extracted from the highest frequency of the applied signal because the equivalent circuit of the fuel cell stack is a series-parallel circuit of low-pass elements of the first order whose cut-off frequencies are clearly far apart and lie much lower.

This error identification and the characterization of the error intensity allows optionally correcting the operating parameters and optimizing them with respect to the longer term.

The sensitivity of the evaluation algorithms is especially advantageous. A decrease in the relative humidity by 10% at a current density of 0.1 A/cm² produces a voltage loss of approximately 8 mV per cell. It is possible by means of the THDA-dryout calculations to recognize and identify even minute performance losses.

Figure 3:
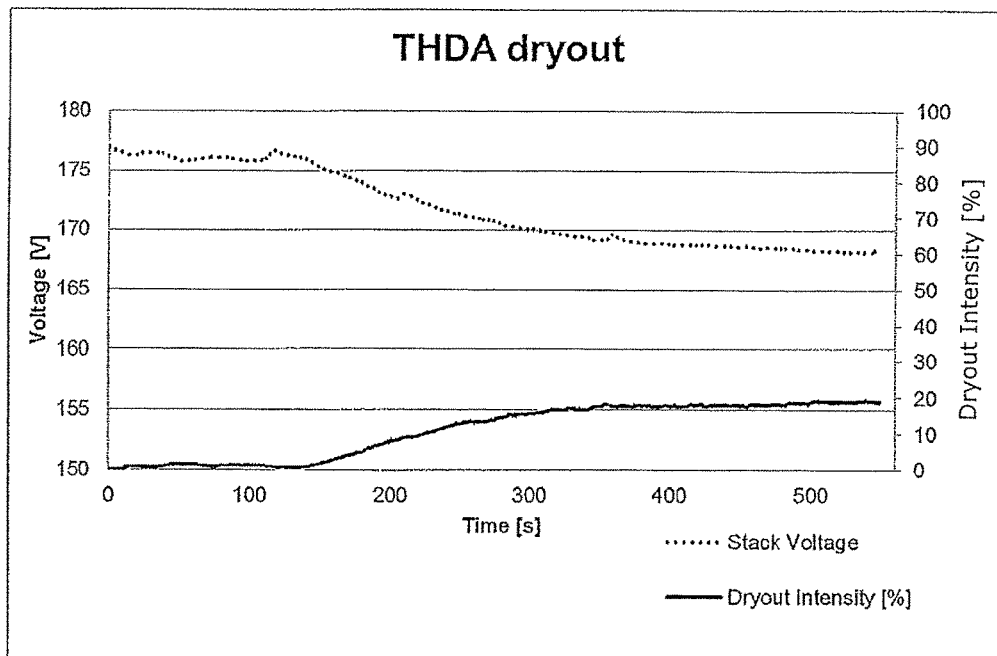
FIG. 3 shows the progression over time of the standardized parameter for $THDA_{dryout}$ in percent with the representation of the stack voltage in volt.

FIG. 3 shows the progression over time of the voltage of a fuel cell stack (dotted line) at constant current (~210 A). The drop in voltage was caused by drying out of the membrane. The rise in the dryout intensity simultaneously with the drop in voltage is shown clearly.

$THDA_{low\ media}$

Fuel cells convert chemical reaction energy into electrical energy. Two media, i.e. fuel (hydrogen) and the oxidizing agent (usually atmospheric oxygen), must be supplied continuously for this purpose. The optimal supply of media therefore places an important role in the efficient operation of a fuel cell.

There can be various causes if an undersupply with media occurs. The common consequence is a drop in the performance of the cell or the stack. Serious or prolonged undersupply with media usually leads to irreparable damage to the cell.

The reasons for the undersupply with media can be wrong gas concentrations or flows among other things. The formation of water droplets in gas conduits can also slow down the supply with media.

On the other hand, a lower flow of air leads to a more inadequate removal of the water, which is produced as the end product in the reduction on the cathode.

If too little fuel (i.e. hydrogen) is available, the chemical reaction slows down and the performance of the fuel cell decreases. If a massive undersupply of fuel occurs, local overheating and irreparable damage to the polymer electrolyte membrane will occur.

The voltage drop caused by the undersupply of media can be monitored well by means of conventional measuring methods. The specific advantage in the identification of the cause is offered by the THDA analytical function $THDA_{low\ media}$.

Inadequate supply with media is detected by means of three parameters. Both the internal resistance $R_i$ and also the distortion factor thd of voltage signal of the system response to the applied signal as well as an impedance $R_{lm}$ of the low-frequency signal play an important role in this case.

$$THDA_{lowmedia} = \alpha_1 \cdot f_1(thd) + \alpha_2 \cdot f_2(R_i) + \alpha_3 \cdot f_3(R_{lm}) \quad \text{eqn. 2,}$$

with system-dependent weightings $\alpha_1, \alpha_2, \alpha_3$ with $0 < \alpha_1, \alpha_2, \alpha_3 < 1$, wherein $\alpha_1 + \alpha_2 + \alpha_3 = 1$ and evaluation functions $f_1, f_2, f_3$. The internal resistance $R_i$ is obtained as a sum total of the ohmic resistances $R_m$, $R_1$ und $R_2$ and is calculated online with the following equation:

$$R_i = \frac{V_0 - V}{I \cdot n_{cells}},$$

wherein V concerns the stack voltage, I the stack current, $V_0$ the open-circuit voltage and $n_{cells}$ the number of the Individual cells in the stack.

The evaluation functions $f_1, f_2, f_3$ are used for signal smoothing and are highly system-dependent. Said evaluation functions and the weighting parameters can be determined by calibration measurements by following a specific protocol in such a way that the signal is as noise-free as possible and the information content is maximized. The focus in eqn. 2 is usually on the second and third term.

For the purpose of differentiating between undersupply of fuel and oxidation agent, the combination of several THDA diagnostic channels can be helpful. If $THDA_{low\ media}$ rises in combination with $THDA_{liquid}$, there is a high probability of a stoichiometric undersupply on the cathode side, whereas the combination of $THDA_{low\ media}$ and $THDA_{dryout}$ allows drawing a conclusion on the undersupply with media on the anode side.

Figure 4:
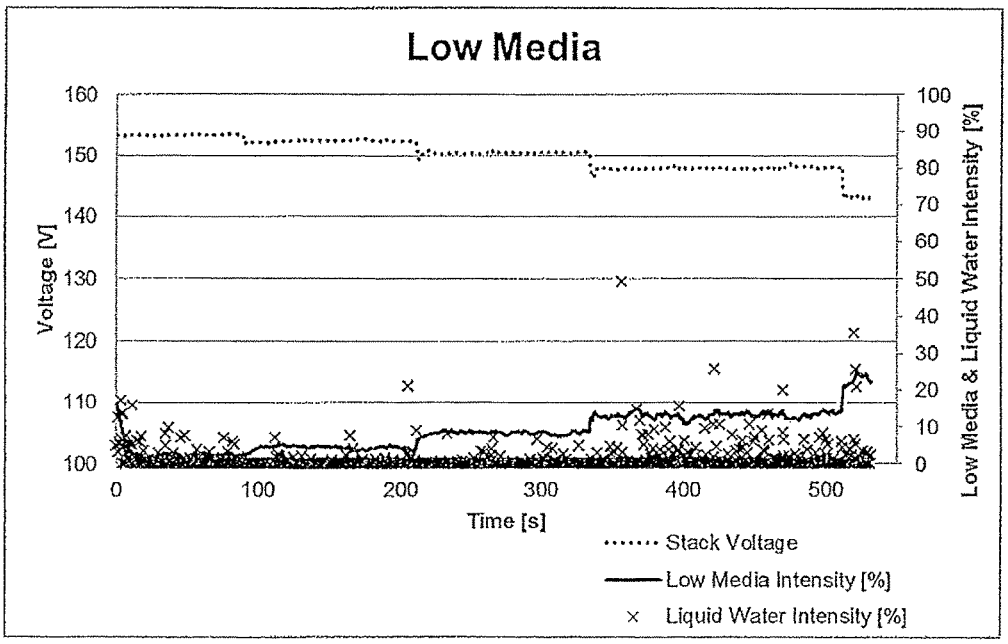
FIG. 4 shows the progression over time of the standardized parameter for $THDA_{low\ media}$ in percent with the representation of the stack voltage in volt.

FIG. 4 shows the progression over time of the fuel cell stack at constant current (~450 A). The voltage drop (shown with the dotted line) was induced by step-by-step reduction in the air supply. This renders the removal of water on the cathode side more difficult. The illustration shows the respective rise in the THDA diagnostic channels of low media (unbroken line) and liquid water (x).

$THDA_{liquid}$

The correct water management plays an important role in the operation of a PEM fuel cell. On the one hand, water is produced as a side product on the cathode and needs to be discharged from there accordingly. On the other hand, water is introduced into the fuel cell as a result of the humidification of the gases.

Correct humidification is an important aspect in order to ensure optimal functionality of the polymer electrolyte membrane. Drying of the membrane rapidly leads to losses in performance and can permanently damage a fuel cell. Conversely, excessive humidity is also not optimal.

If water droplets are formed which cannot be discharged, this will also lead decreases in performance. Such water droplets can reach the gas diffusion layer and block gas conduits. This may obstruct gas supply and the performance of the fuel cell stack decreases.

If the flooding of a fuel cell occurs, this can be monitored by the drop in the cell voltage. The allocation of a voltage drop to the causing error in the cell is enabled by the analytical function $THDA_{liquid}$.

The accumulation of water droplets produces non-linearities and thus harmonics in the voltage response to the applied signal of the THDA measuring instrument.

The occurrence of water accumulations in the gas conduits can be monitored by an examination of the distortion factor. Rapid minor fluctuations in the voltage curve are also used as an indicator. The following equation is obtained:

$$THDA_{liquid} = \alpha_0 \cdot f(\alpha_1 \cdot abs(thd_{dif0}) + \alpha_2 \cdot abs(thd_{dif1})) + \alpha_3 \cdot fd(V) \quad \text{eqn. 3,}$$

wherein the weightings $\alpha_0, \alpha_1, \alpha_2, \alpha_3$ are system-dependent parameters with $0 < \alpha_0, \alpha_1, \alpha_2, \alpha_3 < 1$, f is a polynomial or a logarithmic function for smoothing and filtering the signals, and $thd_{dif0}$ and $thd_{dif1}$ concern a linear combination of the distortion factors of current and voltage of the two measured channels (current, voltage). The smoothing function f and the weightings $\alpha_0, \alpha_1, \alpha_2, \alpha_3$ are highly dependent on the system configuration and can be determined or adjusted by calibration measurements that follow special test programs in order to optimize the precision and the interpretability of the result of the calculation.

In order to suppress disturbances in the distortion factor, the difference ($thd_{dif0}$, $thd_{dif1}$) between the two is formed once the disturbances have an effect in the current and voltage distortion factor. Furthermore, the two lowest frequencies of the applied signal are preferably chosen very close to one another because in the case of a disturbance of the distortion factor the other (disturbance-free) frequency can be used.

The term fd(V), i.e. the finite difference of the voltage values, is optional because these values too can clearly indicate the occurrence of water droplets depending on the type of the fuel cell.

Figure 5:
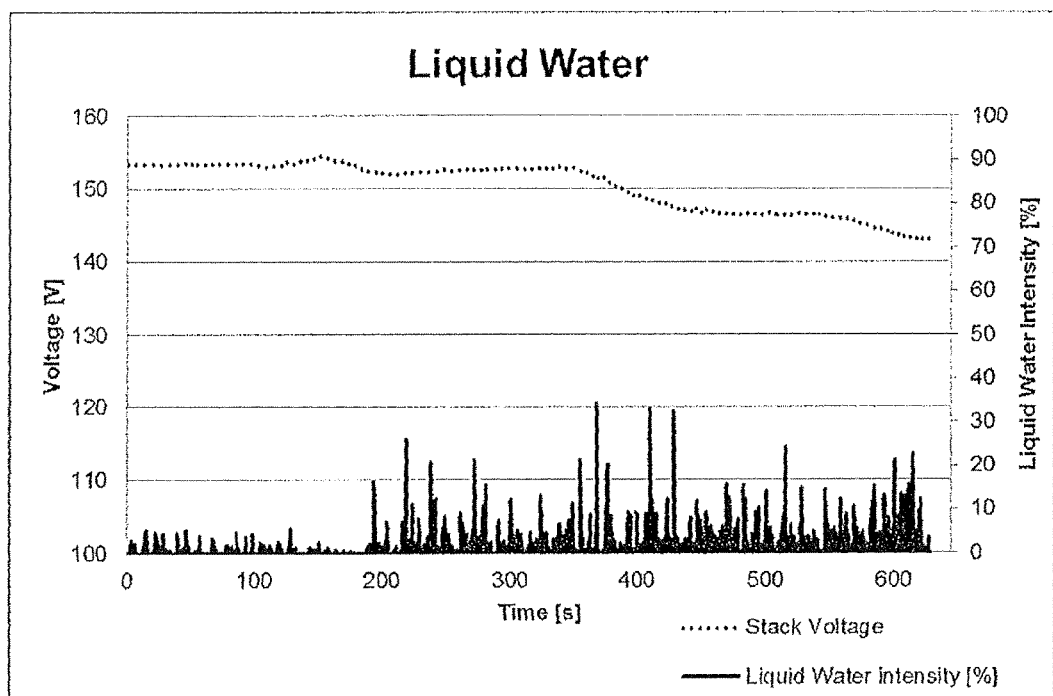
FIG. 5 shows the progression over time of the standardized parameter for $THDA_{liquid}$ in percent with the representation of the stack voltage in volt.

FIG. 5 shows the progression over time of the voltage (dotted line) of a fuel cell stack at constant current (~450 A). The formation of water droplets was induced by the changed operating parameters and a drop in voltage was caused. The THDA diagnostic channel "Liquid Water" shows the correlation between voltage drop and droplet formation.

State of Health (SoH)—Degree of Ageing

The result of the state of health measurement reflects the degree of ageing of the stack. In this case, a new stack is assigned 100% SoH and 0% SoH to a stack which is at the end of its operational lifespan (e.g. 90% loss in performance). The following equations can be made by means of impedance measurement in the simplified electrical equivalent circuit (see FIG. 1).

$$Z_{FC} = \frac{R_1}{1+\Omega_1^2}[1-j\Omega_1] + \frac{R_2}{1+\Omega_2^2}[1-j\Omega_2] + R_m[1+j\Omega_3]$$

with $$\Omega_1 = \omega_1 R_1 C_1, \Omega_2 = \omega_2 R_2 C_2, \Omega_3 = \omega_3 L_m,$$

wherein $\omega_1$, $\omega_2$, und $\omega_3$ concern the respective angular frequencies.

If the real and imaginary part of the above complex impedance is regarded separately, the following is obtained:

$$\text{Re}\{Z_{FC}\} = \frac{R_1}{1+\Omega_1^2} + \frac{R_2}{1+\Omega_2^2} + R_m \text{ and}$$

$$\text{Im}\{Z_{FC}\} = -\frac{R_1\Omega_1}{1+\Omega_1^2} - \frac{R_2\Omega_2}{1+\Omega_2^2} + R_m\Omega_3$$

A simplification in these equations leads to the following:

$$\text{Re}\{Z_{FC}\} = \frac{R_1}{1+\Omega_1^2} + \frac{R_2}{1+\Omega_2^2} + R_m \text{ or}$$

$$\text{Im}\{Z_{FC}\} \approx -\frac{R_1\Omega_1}{1+\Omega_1^2} - \frac{R_2\Omega_2}{1+\Omega_2^2}$$

for frequencies between 5 and 10 Hz.

$$\text{Re}\{Z_{FC}\} \approx \frac{R_2}{1+\Omega_2^2} + R_m \text{ or } \text{Im}\{Z_{FC}\} \approx -\frac{R_1}{\Omega_1} - \frac{R_2\Omega_2}{1+\Omega_2^2} + R_m\Omega_3$$

for frequencies between 10 and 100 Hz, and $$\text{Re}\{Z_{FC}\} \approx R_m \text{ or } \text{Im}\{Z_{FC}\} \approx -\frac{R_1}{\Omega_1} - \frac{R_2}{\Omega_2} + R_m\Omega_3$$

for frequencies over 400 Hz.

These equations are prepared for three frequencies and the respective real and imaginary parts of the impedances and resolved according to $C_1$, $C_2$, $L_m$, $R_1$ and $R_2$. It was surprisingly noticed that ageing correlates distinctly and approximately linearly with the two double-layer capacitances $C_1$ (on the cathode side) and $C_2$ (on the anode side) and with the ohmic resistances of cathode ($R_1$) and anode ($R_2$).

Numeric solving of the equation system produces current values for the individual components. The ohmic resistances are not used for ageing measurement but only the double-layer capacitances for the following practical reasons:

Too many ancillary influences, i.e. ohmic resistances, also correlate strongly with operating parameters such as pressure, temperature and media stoichiometry.

Very low frequencies (e.g. beneath 1 Hz) are unnecessary for the reliable determination of the ohmic resistances. Disadvantage: too long measuring times and too significant disturbing influences which are derived from the load dynamics.

Consequently, only $C_1$ and $C_2$ are used for calculating the value. The following equation is used for this purpose:

$$SoH = \alpha_1 \cdot \left(100 \cdot \frac{C_1}{0.75\overline{C_1}} - \frac{100}{3}\right) + \alpha_2 \cdot \left(100 \cdot \frac{C_2}{0.75\overline{C_2}} - \frac{100}{3}\right), \quad \text{Eqn. 4}$$

with system-dependent weightings $\alpha_1, \alpha_2$ with $0<\alpha_1,\alpha_2<1$, wherein $\alpha_1+\alpha_2=1$ and the starting values $\overline{C_1}$ and $\overline{C_2}$. The weighting $\alpha_1,\alpha_2$ is system-dependent and it can be determined by initial calibration measurements which of the two terms shall have a higher influence on the total result. The second term is usually more meaningful and thus weighted more strongly.

An advantageous method is applied for minimizing errors in ageing calculation by means of a simplified equivalent circuit instead of known complex and precisely adjusted equivalent circuits. The three measuring frequencies are selected in such a way that the impedance curve of the simplified equivalent circuit coincides with the real impedance curve of the fuel cell precisely in these three frequencies.

In order to ensure the reliability of the above equations, the used quantities are smoothed as required by using sliding weighted averaging. This corresponds to a filter that dampens high frequencies.

Figure 6:
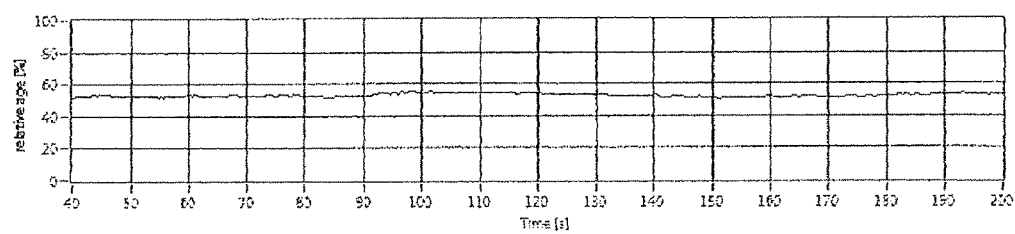
FIG. 6 shows the progression over time of the degree of ageing SoH of a stack approximately in the middle of the operational lifespan of the stack.
Figure 7:
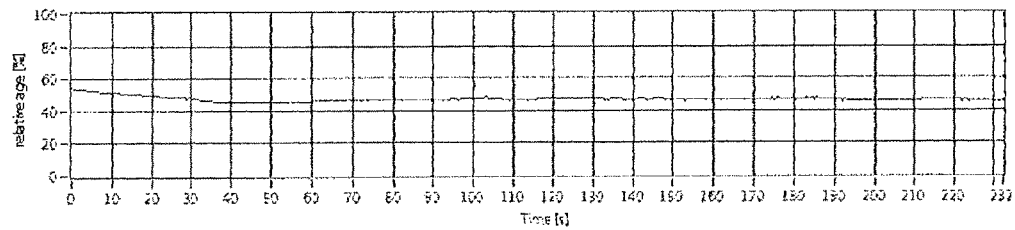
FIG. 7 shows the progression over time of the degree of ageing SoH of a stack in percent after some further days of operation of the stack.

FIG. 6 shows the progression over time of the state of health of a fuel cell stack which is calculated online. At this point in time, the stack has reached approximately half of its operational lifespan (relative age) (~54% SoH). After a number of days of operation under various highly critical conditions, a drop of the SoH to 46% SoH can be observed (see FIG. 7).

Figure 8:
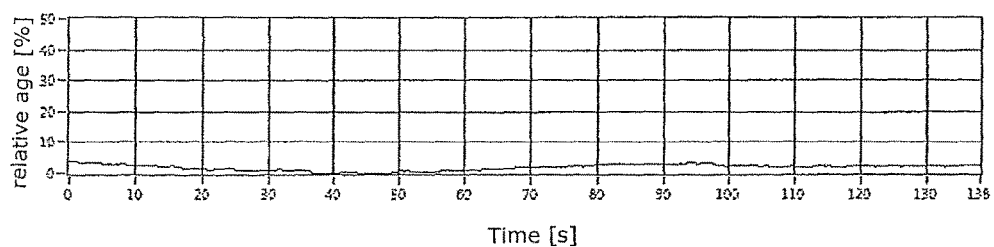
FIG. 8 shows the progression over time of the degree of ageing SoH of a stack in percent at the end of the operational lifespan of the stack.

FIG. 8 shows a further measurement a few months later, wherein the end of the operational lifespan of the stack was nearly reached (~1% SoH).

Minimum of the Cell Voltage Avg-Min

The invention further comprises a method for the numerical determination of the deviation of a cell voltage minimum from the average cell voltage in a fuel cell stack. This method is used as a replacement for an individual cell voltage measuring device.

It is common practice to carry out individual cell voltage measurements for monitoring a fuel cell stack. An individual cell voltage monitoring device (cell Voltage Monitoring CVM) allows monitoring the voltages of every single fuel cell of a stack. It is especially important to recognize whether the voltage of individual cells drops. In the case of a large number of cells, this can no longer be obtained from the total voltage of the stack (the sum total of all individual cell voltages). Specific cases of disturbance (critical states) often have an influence on a low number of cells at the beginning before a significant drop in the total voltage occurs. In order to recognize this, the deviation in the cell voltage minima avg-min from the average cell voltage must be monitored or determined. This quantity thus supplies the deviation of the lowest single cell voltage from the average cell voltage. Single cell voltage monitoring is complex and is an expensive and space-consuming method and thus only useful within limits for series production.

The method in accordance with the invention allows monitoring the avg-min signal without requiring access to the individual cell voltage measuring data. It concerns a method that is based on the THDA method. Conclusions can be drawn on the operating state of the fuel cell stack by means of measurement and the respective analyses of the system response (voltage or current) by applying a modulated current or voltage signal. As described further above, the analysis supplies three characteristics $THDA_{dryout}$, $THDA_{low\ media}$ and $THDA_{liquid}$ for recognizing the state, and also the phase and amplitude of the impedances at different frequencies. Furthermore, the distortion factor thd of the system response is calculated. The method described below uses all measurement quantities from THDA (real and imaginary parts of the impedances, distortion factors, SNR (Signal to Noise Ratio)) in order to thus calculate the avg-min signal.

More precise approximations to the avg-min signal can be reached in steps with three expansion stages in which the THDA measurement data are expanded by new records from physical models. The most important advantage is that the precision of the simulation increases with each stage. Since the amount of calculation will increase in this way, an approach is made to expand the method in a modular fashion.

The first expansion stage increases the input data record by extreme values of the gas concentrations. The maximum water and minimum gas concentrations ($O_2$, $H_2$) can be calculated from the mass flows and gas input concentrations and can be used as further input quantities.

Stage two comprises an expansion in the data records by results of an electrochemical model. This model calculates pressures, temperatures at the gas outputs and voltage differences (Vstack−Vmodel) from reference stack data (voltage-current characteristics at different temperatures and pressures). This information increases the precision in the simulation of the avg-min signal.

If there are precise flow channel geometries of the fuel cell stack, the data record can also be expanded by the calculation results of a simplified thermal model. Local membrane temperatures and temperatures at the anode, cathode and cooling temperatures can be modeled and supply further information as an input for the avg-min algorithm.

An artificial neural network (Artificial Neural Network, ANN) forms the basis for the final data evaluation and algorithm development. It concerns a network of artificial neurons, an abstraction of the natural neurons occurring in the brain which is used in the area of information processing and artificial intelligence. The areas of use for ANN are numerous and range from function fitting and classification problems up to recognition of patterns or also time-series analysis. Once the architecture of the network has been determined, it is trained by means of respective training algorithms, i.e. weightings and parameters in the interior of the network are adjusted.

Figure 9:
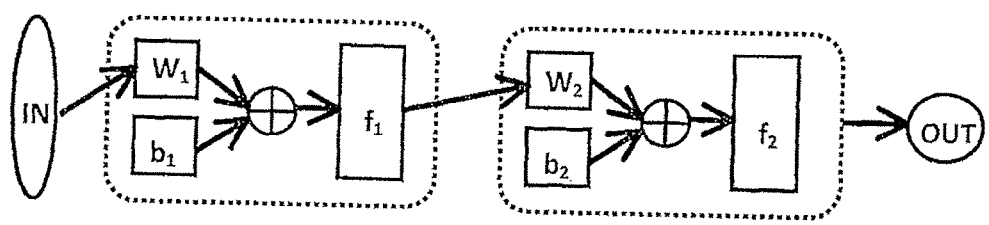
FIG. 9 shows a diagram of a double-layer feed-forward artificial neural network.

A double-layer feed-forward ANN (FFANN) with a fixed number (e.g. 10 neurons) was used in the hidden layer (see FIG. 9) for the simulation of the avg-min signals. All available measurement quantities of the THDA method supply the input quantities for the neural network, wherein the network is trained to the fitting of the original avg-min signals (measured by means of the CVM measuring device) by means of the Levenberg-Marquardt training function.

The result (out) of an FFANN constructed for this method can be described by means of the following equation:

$$\text{out}(\text{in}) = f_2 \cdot (W_2 \cdot f_1(W_1 \cdot \text{in} + b_1) + b_2) \qquad \text{eqn. 5}$$

"in" concerns the data input vector and $f_1$, $f_2$ the transmission functions. The weighting matrixes $W_1$, $W_2$ and the bias vectors $b_1$, $b_2$ are respectively optimized during training.

Since the result of a network trained with the entire data record is not always reliable, the training data quantity S can be divided in a supporting fashion with respect to a threshold value T. The division occurs into two data quantities on the basis of the avg-min signal measured for test purposes on the stack. The first quantity $S_1$ contains all input quantities which correspond to an avg-min signal <T, and the following applies to the second quantity: $S_2 = S \setminus S_1$. This division of the data into two groups can also be interpreted as a classification into "non-critical" and "critical" situations since many systems will switch off or be in a critical state when a value drops beneath a minimum value of the single cell voltage. The selection of the threshold value is system-dependent. The reason for the division is that the respective avg-min values can be simulated better in some cases when one FFANN each is trained per data quantity.

Figure 10:
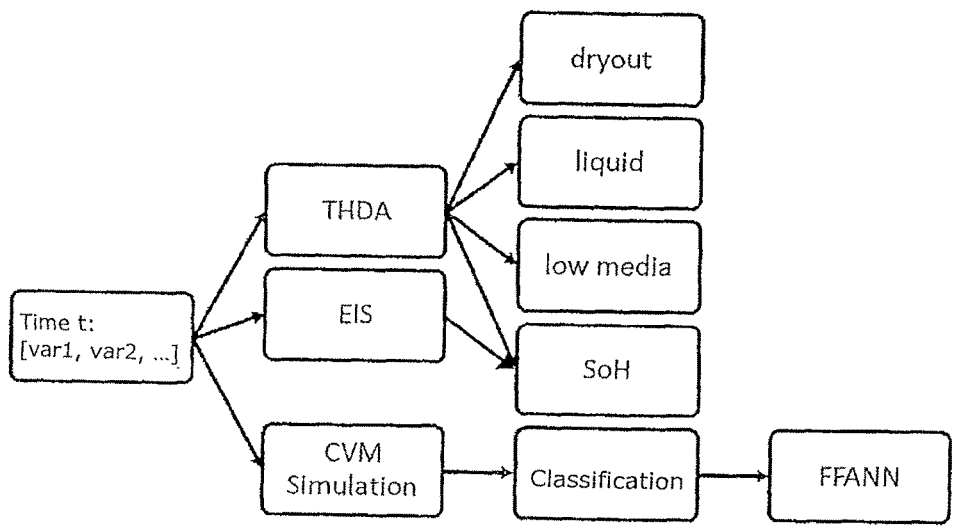
FIG. 10 shows a diagram of a functional record of a THDA diagnostic tool.

The data separation thus leads to two FFANNs $N_1$ and $N_2$, which are trained with the respective data quantities and can be described by two mathematical functions $\text{out}_1$ and $\text{out}_2$. The functional set of the THDA diagnostic tool is expanded with these two new functions (see FIG. 10).

A separation of the data with respect to a system-dependent threshold value occurs online by means of current classification algorithms (Support Vektor Machine, PCA, Nearest Neighbor, Cluster analysis). An observation consisting of one respective instance of each measured value is classified accordingly and then supplies the input quantity for the respective neural network. The degree of the critical state of the fuel cell stack can be estimated depending on the results supplied by these networks and respective further steps such as open-loop and closed-loop control measures can be initiated accordingly.

The invention claimed is:

1. A method for determining critical operating states in a fuel cell stack, consisting of individual cells connected in series, wherein a low-frequency current or voltage signal is applied to the fuel cell stack, the resulting voltage or current signal is measured and the distortion factor thd of the signal is determined, wherein the parameters $thd_{dif0}$ and $thd_{dif1}$ as well as the fluctuations fd(V) in the measured voltage curve are used for determining an indicator $THDA_{liquid}$ correlating with impermissible water accumulations and droplet formations on the membranes of the fuel cell stack, wherein $thd_{dif0}$ and $thd_{dif1}$ respectively concern linear combinations of the distortion factors of current and voltage, and wherein $thd_{dif0}$ comprises the component of the 2nd harmonics and $thd_{dif0}$ the component of the 3rd harmonics.

2. The method according to claim 1, wherein the indicator $THDA_{liquid}$ correlating with impermissible water accumulations and droplet formations on the membranes of the fuel cell stack is determined according to $$THDA_{liquid} = \alpha_0 \cdot f(\alpha_1 \cdot \text{abs}(thd_{dif0}) + \alpha_2 \cdot \text{abs}(thd_{dif1})) + \alpha_3 \cdot fd(V),$$

wherein $\alpha_0, \alpha_1, \alpha_2, \alpha_3$ are system-dependent parameters.

3. The method according to claim 1, wherein a simplified electrical equivalent circuit of the fuel cell stack can be used for additionally determining an Indicator SoH correlating with the ageing of the fuel cell stack, which equivalent circuit at least considers the ohmic resistances $R_1$, $R_2$ of the cathode side and the anode side, as well as the double-layer capacitances $C_1$, $C_2$ on the anode side and the cathode side, wherein an equation system for the variables $R_1$, $R_2$, $C_1$, $C_2$ is set up, which is determined by impedance measurements in at least three measuring frequencies and is used for calculating the indicator SoH.

4. The method according to claim 3, wherein the indicator SoH correlating with the ageing of the fuel cell stack is determined from the parameters $C_1$, $C_2$ of the double-layer capacitances according to $$SoH = \alpha_1 \cdot \left(100 \cdot \frac{C_1}{0.75\overline{C_1}} - \frac{100}{3}\right) + \alpha_2 \cdot \left(100 \cdot \frac{C_2}{0.75\overline{C_2}} - \frac{100}{3}\right),$$

wherein the parameters disregard the ohmic resistances of the cathode side and anode side $R_1$, $R_2$, $\alpha_1 + \alpha_2 = 1$ applies and $\overline{C_1}$ and $\overline{C_2}$ concern starting values of a new fuel cell stack.

5. The method according to claim 3, wherein three measuring frequencies are selected for the calculation, in which the impedance curve of the simplified equivalent circuit coincides substantially with the real impedance curve of the fuel cell stack.

6. The method according to claim 1, wherein a stoichiometric undersupply of the cathode side of the fuel cell stack is determined by the combined occurrence of a rising distortion factor thd according to the indicator $THDA_{liquid}$ and a deviation of internal resistance $R_i$ from a reference value of the internal resistance according to the indicator $THDA_{low\ media}$.

7. The method according to claim 1, wherein an artificial neural network (Artificial Neural Network) ANN is used for the additional determination of an indicator avg-min correlating with the deviation of the minimum cell voltage from the average cell voltage of the fuel cell stack, measured quantities derived from the distortion factor analysis THDA and impedance values derived from the real and imaginary part of the applied current and voltage signal are used as input quantities of the network, wherein the neural network is trained by means of signals from the Individual cell voltage measurements for determining the Internal network parameters.

8. The method according to claim 7, wherein a double-layer feed-forward Artificial Neural Network FFANN is used for simulating the indicator avg-min correlating with the minimum of the cell voltage of an Individual cell of the fuel cell stack, and the neural network is adjusted to the measured values detected by means of individual cell voltage measurement by means of a training function.

9. The method according to claim 7, wherein the quantity of training data is expanded in a modular manner by calculation results from physical models.

10. The method according to claim 8, wherein the training function is the Levenberg-Marquardt training function.

* * * * *